United States Patent
Khusnatdinov et al.

(10) Patent No.: US 8,652,393 B2
(45) Date of Patent: Feb. 18, 2014

(54) STRAIN AND KINETICS CONTROL DURING SEPARATION PHASE OF IMPRINT PROCESS

(75) Inventors: Niyaz Khusnatdinov, Round Rock, TX (US); Frank Y. Xu, Round Rock, TX (US); Mario Johannes Meissl, Austin, TX (US); Michael N. Miller, Austin, TX (US); Ecron D. Thompson, Round Rock, TX (US); Gerard M. Schmid, Austin, TX (US); Pawan Kumar Nimmakayala, Austin, TX (US); Xiaoming Lu, Cedar Park, TX (US); Byung-Jin Choi, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 462 days.

(21) Appl. No.: 12/604,517

(22) Filed: Oct. 23, 2009

(65) Prior Publication Data
US 2010/0102469 A1 Apr. 29, 2010

Related U.S. Application Data

(60) Provisional application No. 61/109,557, filed on Oct. 30, 2008, provisional application No. 61/108,131, filed on Oct. 24, 2008.

(51) Int. Cl.
*B29C 45/76* (2006.01)

(52) U.S. Cl.
USPC .......................................... 264/496; 264/293

(58) Field of Classification Search
USPC ............................................... 264/496, 293
See application file for complete search history.

(56) References Cited

U.S. PATENT DOCUMENTS

| | | | |
|---|---|---|---|
| 6,873,087 B1 | 3/2005 | Choi et al. |
| 6,932,934 B2 | 8/2005 | Choi et al. |
| 6,936,194 B2 | 8/2005 | Watts |
| 6,980,282 B2 | 12/2005 | Choi et al. |
| 6,982,783 B2 | 1/2006 | Choi et al. |
| 7,019,819 B2 | 3/2006 | Choi et al. |
| 7,060,402 B2 | 6/2006 | Choi et al. |
| 7,077,992 B2 | 7/2006 | Sreenivasan et al. |
| 7,150,622 B2 | 12/2006 | Choi et al. |
| 7,157,036 B2 | 1/2007 | Choi et al. |

(Continued)

FOREIGN PATENT DOCUMENTS

| | | |
|---|---|---|
| DE | 20122197 | 9/2004 |
| EP | 1696471 | 8/2006 |

(Continued)

OTHER PUBLICATIONS

Standard operating procedure: spin-on-glass surface level characterization, Christiansen et al, Jun. 8, 2000, 7 pgs.*

(Continued)

*Primary Examiner* — Joseph S Del Sole
*Assistant Examiner* — Kimberly A Stewart
(74) *Attorney, Agent, or Firm* — Cameron A. King

(57) ABSTRACT

Systems and methods for improving robust layer separation during the separation process of an imprint lithography process are described. Included are methods of matching strains between a substrate to be imprinted and the template, varying or modifying the forces applied to the template and/or the substrate during separation, or varying or modifying the kinetics of the separation process.

6 Claims, 8 Drawing Sheets

(56) References Cited

U.S. PATENT DOCUMENTS

| | | |
|---|---|---|
| 7,179,079 B2 | 2/2007 | Sreenivasan et al. |
| 7,179,396 B2 | 2/2007 | Sreenivasan |
| 7,224,443 B2 | 5/2007 | Choi et al. |
| 7,245,358 B2 | 7/2007 | Nimmakayala et al. |
| 7,259,833 B2 | 8/2007 | Nimmakayala et al. |
| 7,307,697 B2 | 12/2007 | GanapathiSubramanian et al. |
| 7,396,475 B2 | 7/2008 | Sreenivasan |
| 7,504,268 B2 | 3/2009 | GanapathiSubramanian et al. |
| 7,635,263 B2 | 12/2009 | Cherala et al. |
| 7,635,445 B2 | 12/2009 | Choi et al. |
| 7,636,999 B2 | 12/2009 | Choi et al. |
| 7,641,840 B2 | 1/2010 | Choi et al. |
| 7,670,529 B2 | 3/2010 | Choi et al. |
| 7,670,530 B2 | 3/2010 | Choi et al. |
| 7,691,313 B2 | 4/2010 | Choi et al. |
| 7,708,926 B2 | 5/2010 | Choi et al. |
| 2003/0039897 A1 | 2/2003 | Morita |
| 2004/0065252 A1 | 4/2004 | Sreenivasan et al. |
| 2004/0065976 A1 | 4/2004 | Sreenivasan et al. |
| 2004/0168613 A1 | 9/2004 | Nguyen et al. |
| 2004/0192041 A1 | 9/2004 | Jeong et al. |
| 2005/0064344 A1 | 3/2005 | Bailey et al. |
| 2005/0187339 A1 | 8/2005 | Xu et al. |
| 2005/0193364 A1 | 9/2005 | Kotani et al. |
| 2006/0081557 A1 | 4/2006 | Xu et al. |
| 2006/0131785 A1 | 6/2006 | Sewell |
| 2006/0145398 A1 | 7/2006 | Bailey et al. |
| 2006/0158647 A1* | 7/2006 | Yao ............................ 356/326 |
| 2006/0172031 A1 | 8/2006 | Babbs et al. |
| 2006/0172549 A1* | 8/2006 | Choi et al. .................... 438/758 |
| 2006/0180952 A1 | 8/2006 | Kruijt-Stegeman |
| 2006/0192320 A1 | 8/2006 | Tokita et al. |
| 2006/0230959 A1 | 10/2006 | Meijer et al. |
| 2007/0035717 A1 | 2/2007 | Wu et al. |
| 2007/0114686 A1* | 5/2007 | Choi et al. .................... 264/2.7 |
| 2007/0126156 A1 | 6/2007 | Mahadevan et al. |
| 2007/0132152 A1 | 6/2007 | Choi et al. |
| 2007/0164487 A1 | 7/2007 | Beck et al. |
| 2007/0170617 A1 | 7/2007 | Choi et al. |
| 2007/0190200 A1* | 8/2007 | Cherala et al. ................ 425/385 |
| 2007/0231422 A1 | 10/2007 | Cherala et al. |
| 2007/0287081 A1 | 12/2007 | Cherala et al. |
| 2008/0029931 A1 | 2/2008 | Tada et al. |
| 2008/0093339 A1 | 4/2008 | Kasumi et al. |
| 2008/0160129 A1 | 7/2008 | Resnick et al. |
| 2008/0203271 A1 | 8/2008 | Okinaka et al. |
| 2008/0204693 A1 | 8/2008 | Nimmakayala et al. |
| 2009/0140458 A1 | 6/2009 | Xu et al. |
| 2010/0096776 A1 | 4/2010 | Xu et al. |
| 2010/0110409 A1 | 5/2010 | Choi et al. |

FOREIGN PATENT DOCUMENTS

| | | |
|---|---|---|
| EP | 1787788 A2 | 5/2007 |
| EP | 1795959 A1 | 6/2007 |
| EP | 1844830 A1 | 2/2008 |
| WO | WO 01/42858 A1 | 6/2001 |
| WO | WO 2004/044651 | 5/2004 |
| WO | WO 2007/136832 | 11/2007 |

OTHER PUBLICATIONS

Nanoimprint lithography: an old story in modern times? a review, Schift, Mar. 27, 2008, pp. 458-480.*

Sohn et al., Nanoimprinting of thin polymer films using elementwise patterned stamp and subsequent application of pressurized air, Japanese Joournal of Applied Physics, Japan Society of Applied Physics, Tokyo, JP vol. 45, No. 7, pp. 5902-2905 Jul. 1, 2006.

Landis et al., Quantitative characterizations of a nanopatterned bonded wafer: force determination for nanoimprint lithography stamp removal, Nanotechnology 19, 2008, at 125305 (13pp), Feb. 20, 2008.

Landis et al.,Stamp design effect on 100nnn feature size for 8 inch nanoimprint lithography, Nanotechnology, IOP. Bristol GB, vol. 17 No. 10, pp. 2701-2709, May 28, 2006.

* cited by examiner

US 8,652,393 B2

STRAIN AND KINETICS CONTROL DURING SEPARATION PHASE OF IMPRINT PROCESS

REFERENCE TO RELATED APPLICATION

This patent application claims the benefit of U.S. Provisional Application Ser. No. 61/109,557, filed Oct. 30, 2008, and U.S. Provisional Application Ser. No. 61/108,131, filed Oct. 24, 2008, both of which are incorporated by reference herein.

BACKGROUND INFORMATION

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate; therefore nano-fabrication becomes increasingly important. Nano-fabrication provides greater process control while allowing continued reduction of the minimum feature dimensions of the structures formed. Other areas of development in which nano-fabrication has been employed include biotechnology, optical technology, mechanical systems, and the like.

An exemplary nano-fabrication technique in use today is commonly referred to as imprint lithography. Exemplary imprint lithography processes are described in detail in numerous publications, such as U.S. Patent Publication No 2004/0065976, U.S. Patent Publication No. 2004/0065252, and U.S. Pat. No. 6,936,194, all of which are hereby incorporated by reference.

An imprint lithography technique disclosed in each of the aforementioned U.S. patent publications and patent includes formation of a relief pattern in a formable liquid (polymerizable liquid) and transferring a pattern corresponding to the relief pattern into an underlying substrate. The substrate may be coupled to a motion stage to obtain a desired positioning to facilitate the patterning process. The patterning process uses a template spaced apart from the substrate and a formable liquid applied between the template and the substrate. The formable liquid is solidified to form a rigid layer (a solidified layer) that has a pattern conforming to a shape of the surface of the template that contacts the formable liquid. After solidification, the template is separated from the rigid layer such that the template and the substrate are spaced apart. The substrate and the solidified layer are then subjected to additional processes to transfer a relief image into the substrate that corresponds to the pattern in the solidified layer.

In imprint technology, defects like sheared, pulled-out, and torn features may be observed in resulting imprinted patterns. A defect often occurs due to strain mismatch of the template and substrate during separation. The resulting patterned features may be tilted and/or damaged, with the greatest effects often on the smallest features. The separation effects may also have radial dependence. Transition from zones of high feature density to low feature density may also lead to a large number of imprint defects, often the result of a sudden change in shear mismatch between the template and substrate.

Current imprint methods often use templates of arbitrary thickness and shape, as well as arbitrary thickness of wafers and disks (substrates). Also, separation phase imprint parameters like separation forces, tilt, pressures behind template and wafer, vacuum levels, and kinetics of all the above parameters may not be taken into account in current imprint methods with respect to improving the quality of imprinting.

BRIEF DESCRIPTION OF DRAWINGS

So that the present invention may be understood in more detail, a description of embodiments of the invention is provided with reference to the embodiments illustrated in the appended drawings. It is to be noted, however, that the appended drawings illustrate only typical embodiments of the invention, and are therefore not to be considered limiting of the scope.

FIG. 10 illustrates a simplified side view of portions of the lithographic system shown in FIG. 1, including the substrate and template having a patterned layer positioned there between.

DETAILED DESCRIPTION

Figure 1:
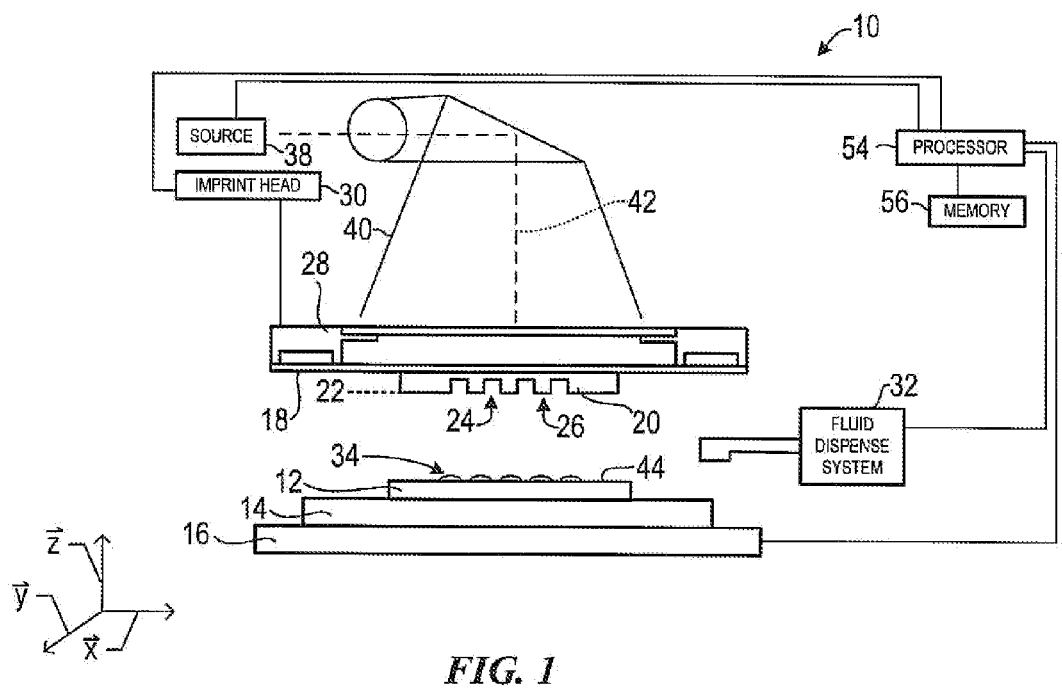
FIG. 1 illustrates a simplified side view of a lithographic system in accordance with an embodiment of the present invention.

Referring to the figures, and particularly to FIG. 1, illustrated therein is a lithographic system 10 used to form a relief pattern on substrate 12. Substrate 12 may be coupled to substrate chuck 14. As illustrated, substrate chuck 14 is a vacuum chuck. Substrate chuck 14, however, may be any chuck including, but not limited to, vacuum, pin-type, groove-type, electromagnetic, and/or the like. Exemplary chucks are described in U.S. Pat. No. 6,873,087, which is hereby incorporated by reference.

Substrate 12 and substrate chuck 14 may be further supported by stage 16. Stage 16 may provide motion along the x-, y-, and z-axes. Stage 16, substrate 12, and substrate chuck 14 may also be positioned on a base (not shown).

Spaced-apart from substrate 12 is a template 18. Template 18 generally includes a mesa 20 extending therefrom towards substrate 12, mesa 20 having a patterning surface 22 thereon. Further, mesa 20 may be referred to as mold 20. Template 18 and/or mold 20 may be formed from such materials including, but not limited to, fused-silica, quartz, silicon, organic polymers, siloxane polymers, borosilicate glass, fluorocarbon polymers, metal, hardened sapphire, and/or the like. As illustrated, patterning surface 22 comprises features defined by a plurality of spaced-apart recesses 24 and/or protrusions 26, though embodiments of the present invention are not limited to such configurations. Patterning surface 22 may define any original pattern that forms the basis of a pattern to be formed on substrate 12.

Template 18 may be coupled to chuck 28. Chuck 28 may be configured as, but not limited to, vacuum, pin-type, groove-type, electromagnetic, and/or other similar chuck types. Exemplary chucks are further described in U.S. Pat. No. 6,873,087, which is hereby incorporated by reference. Further, chuck 28 may be coupled to imprint head 30 such that chuck 28 and/or imprint head 30 may be configured to facilitate movement of template 18.

System 10 may further comprise a fluid dispense system 32. Fluid dispense system 32 may be used to deposit polymerizable material 34 on substrate 12. Polymerizable material 34 may be positioned upon substrate 12 using techniques such as drop dispense, spin-coating, dip coating, chemical vapor deposition (CVD), physical vapor deposition (PVD), thin film deposition, thick film deposition, and/or the like. Polymerizable material 34 may be disposed upon substrate 12 before and/or after a desired volume is defined between mold 20 and substrate 12 depending on design considerations. Polymerizable material 34 may comprise a monomer as described in U.S. Pat. No. 7,157,036 and U.S. Patent Publication No. 2005/0187339, all of which are hereby incorporated by reference.

Figure 2:
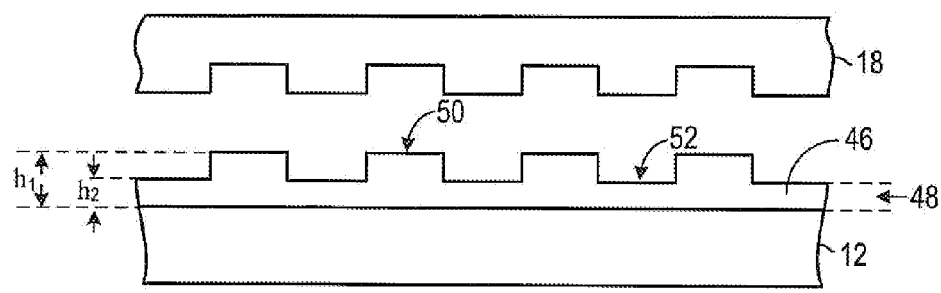
FIG. 2 illustrates a simplified side view of the substrate and template shown in FIG. 1 having a patterned layer positioned thereon.

Referring to FIGS. 1 and 2, system 10 may further comprise an energy source 38 coupled to direct energy 40 along path 42. Imprint head 30 and stage 16 may be configured to position template 18 and substrate 12 in superimposition with path 42. System 10 may be regulated by a processor 54 in communication with stage 16, imprint head 30, fluid dispense system 32, and/or source 38, and may operate on a computer readable program stored in memory 56.

Either imprint head 30, stage 16, or both vary a distance between mold 20 and substrate 12 to define a desired volume therebetween that is filled by polymerizable material 34. For example, imprint head 30 may apply a force to template 18 such that mold 20 contacts polymerizable material 34. After the desired volume is filled with polymerizable material 34, source 38 produces energy 40, e.g., broadband ultraviolet radiation, causing polymerizable material 34 to solidify and/or cross-link conforming to shape of a surface 44 of substrate 12 and patterning surface 22, defining a patterned layer 46 on substrate 12. Patterned layer (solidified layer) 46 may comprise a residual layer 48 and a plurality of features shown as protrusions 50 and recessions 52, with protrusions 50 having thickness $h_1$ and residual layer having a thickness $h_2$.

The above-mentioned system and process may be further employed in imprint lithography processes and systems referred to in U.S. Pat. No. 6,932,934, U.S. Patent Publication No. 2004/0124566, U.S. Patent Publication No. 2004/0188381, and U.S. Patent Publication No. 2004/0211754, each of which is hereby incorporated by reference.

Robust Layer Separation

Still referring to FIGS. 1 and 2, strain differences in template 18 and substrate 12 lead to deformation of imprinted features, pull-outs, line collapse, and/or other imprint defects during separation of the template 18 and the substrate 12 after an imprint process. Strain and related stress may be based upon a geometry of template 18 and substrate 12, forces applied, and kinetics of the process. In one embodiment, the strain and related stress is based solely upon a geometry of template 18 and substrate 12, forces applied, and kinetics of the process. Stiffness and Young modulus of the materials involved may be taken into account. Adhesion force between imprint material 34 and substrate 12, and between imprint material 34 and template 18, as well as friction between the patterning surface 22 and resulting features on the substrate 12 during separation should be considered in a strain analysis. Variation of feature density on the patterning surface 22 of the template 18 play an important role in crack propagation dynamics and significantly affects resulting strains and quality of imprinting, including robust layer separation.

Matching Strains

Figure 3A:
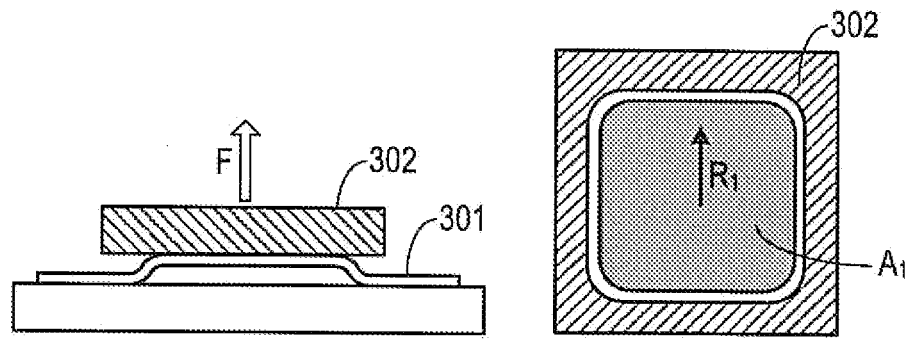
FIGS. 3A and 3B illustrate shrinkage of the contact area during a separation event.
Figure 3B:
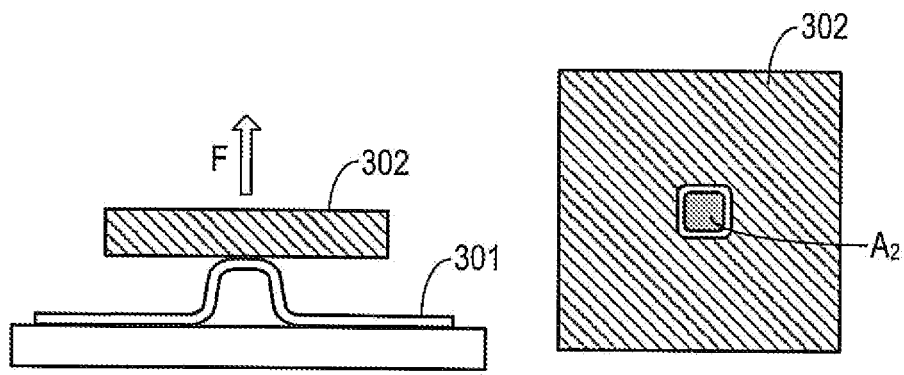

FIGS. 3A and 3B illustrate an example of two time moments $t_1$ and $t_2$ during a separation process. For simplicity, consider a flexible substrate (wafer) 301 and less flexible template 302, which is relatively thick by comparison with flexible substrate 301. A constant force F is applied to separate the template 302 and the substrate 301. In the illustrations in FIGS. 3A and 3B, the contact areas (shown as $A_1$ and $A_2$) are the areas where the substrate 301 is in contact with the template 302 during the separation process. As shown, the contact area at time $t_1$ is $A_1$ and the contact area at time $t_2$ is $A_2$. The contact area $A_2$ at $t_2$ is smaller than the contact area $A_1$ at $t_1$ (where $t_2 > t_1$), as the template 302 and the substrate 301 are pulled away from each other. The strain in the substrate 301 along the perimeter of the contact area $A_2$ will be significantly greater than with contact area $A_1$, if the force F applied is not properly decreased while the contact area shrinks from a larger area $A_1$ to a smaller area $A_2$. This may increase the local stress thereof, and correspondingly, the local strain.

Shear stress along the substrate 301 surface may lead to surface strain, elongation, or compression along its surface. If the template 302 has imprinted features upon the substrate 301, then the resulting strain may shear the features off the substrate 301 during separation.

Figure 4:
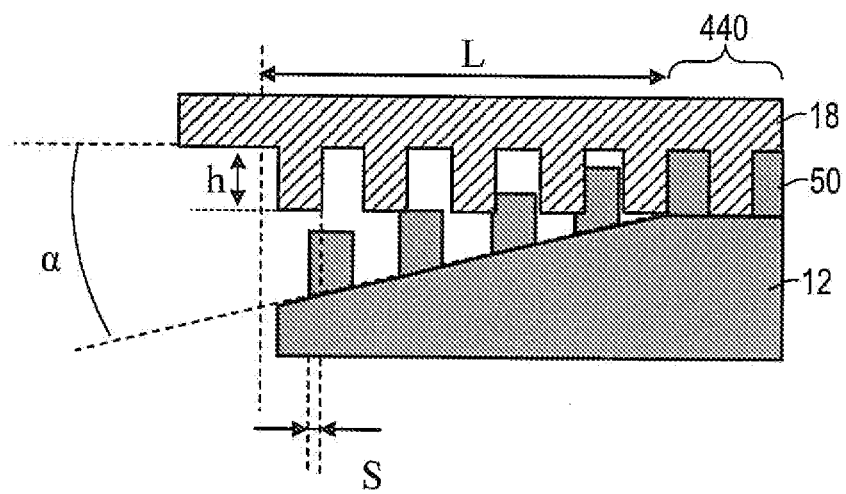
FIG. 4 illustrates schematically an interface between a rigid patterned template (top) and a flexible substrate (bottom) with a replicated layer thereon.

FIG. 4 schematically illustrates the area of separation between a rigid patterned template 18 and a flexible substrate 12 with a replicated layer including features 50 on it. Typical feature height h is 100 nm.

One of the ways to minimize, if not prevent, the effect of uneven stress and strain during separation is to substantially match strains in the template 18 and substrate 12. For example, matching strains may include matching the stiffness of the template 18 and substrate 12. Matching stiffness may take into account the geometry of the template 18 and substrate 12, including the thickness of each. In one embodiment, the thickness of the substrate 12 is matched to the thickness of the template 18, such that they have substantially equal thickness. As used in this application, matching may include conforming, adjusting, adapting, modifying, fitting, tuning, or the like; such that the strain properties are reasonably equal or equivalent, or such that a response from the substrate 12 is the same or nearly the same as a response from the template 18 when equivalent forces are applied to each. Young modulus, orientation (tilt), and other factors may also be used to minimize, if not prevent, the effect of uneven stress and strain during separation.

In one embodiment (shown in FIG. 2), matching the stiffness of the template 18 and substrate 12 may be accomplished by increasing the thickness $h_2$ of the residual layer 48. Residual layer 48 is the result of positioning polymerizable material 34 upon substrate 12 during the imprint process. Additional polymizerable material 34 may be positioned upon substrate 12 during the imprint process to build up the overall thickness of the substrate 12, thereby changing the overall geometry and stiffness characteristics of the substrate 12, and reducing the pulling stress and/or shearing stress during separation of the template 18 and the substrate 12. In an exemplary embodiment, a predetermined amount of polymerizable material 34 is positioned on substrate 12 that is calculated to produce a desired geometry and/or desired stiffness and/or stress characteristics.

Figure 5:
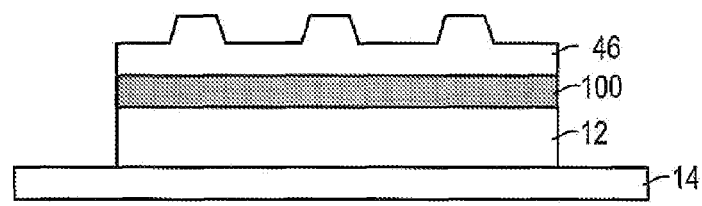
FIG. 5 illustrates a simplified side view of a substrate having a stiffening layer added to the surface of the substrate prior to the imprint process.

In an embodiment illustrated in FIG. 5, a stiffening layer 100 may be added to the surface of substrate 12 prior to the imprint process. For example, the stiffening layer 100 may be an organic layer, such as a Spun On Glass (SOG) layer, or the like. The stiffening layer 100 may be added to the surface of substrate 12 prior to the imprint process. The addition of the stiffening layer 100 changes the overall geometry and stiffness characteristics of the substrate 12. This change in the substrate 12 properties results in reduced pulling stress and/or shearing stress during separation of the template 18 (not shown) and the substrate 12. In an exemplary embodiment, a predetermined thickness of a stiffening layer 100 is added to the surface of substrate 12 that is calculated to produce a desired geometry and/or desired stiffness and/or stress characteristics. The changes to the geometry, stiffness, and/or stress characteristics may result in a more robust layer separation, with fewer and/or smaller imprint separation defects.

Figure 6:
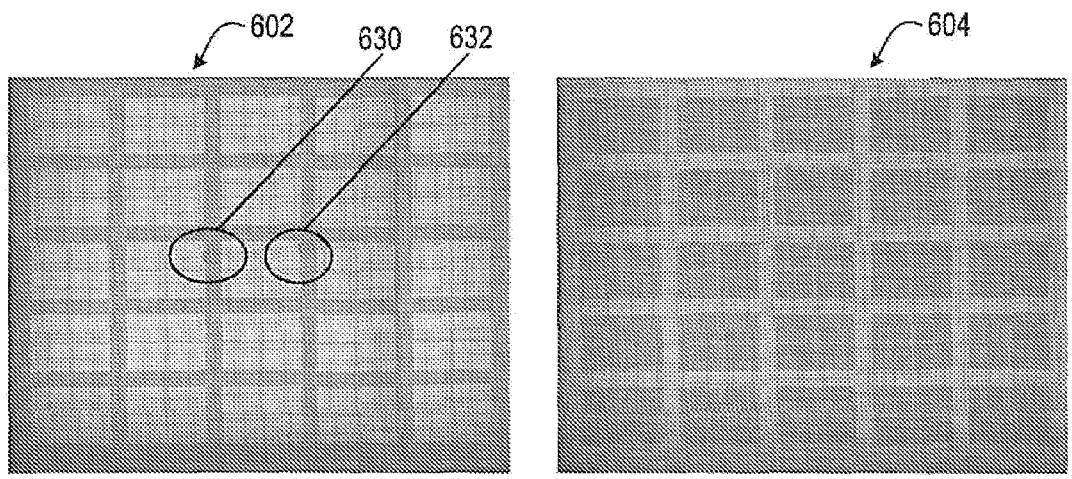
FIG. 6 illustrates a comparison between a wafer and a SOG wafer, wherein the wafer has multiple separation defects.

For example, FIG. 6 is an illustration of two imprinted substrates; the first substrate 602 shows the results of imprinting on a substrate 12 without a stiffening layer 100, and the second substrate 604 shows the results of imprinting on a substrate 12 with a stiffening layer 100 added prior to imprinting. As illustrated in FIG. 6, the regular wafer (substrate 602) without the stiffening layer 100 shows separation defects at 630 and 632 resulting from the separation process. However, the wafer (substrate 604) with the stiffening layer 100 added to the surface of the substrate 12 prior to imprinting shows no separation defects.

Varying the Magnitude of Applied Forces

Matching strains when a template 18 has areas of varying feature density presents unique challenges. In an exemplary embodiment, the forces applied to the substrate 12 and the template 18 during the separation process may be varied or manipulated to achieve a more robust layer separation.

Figure 7A:
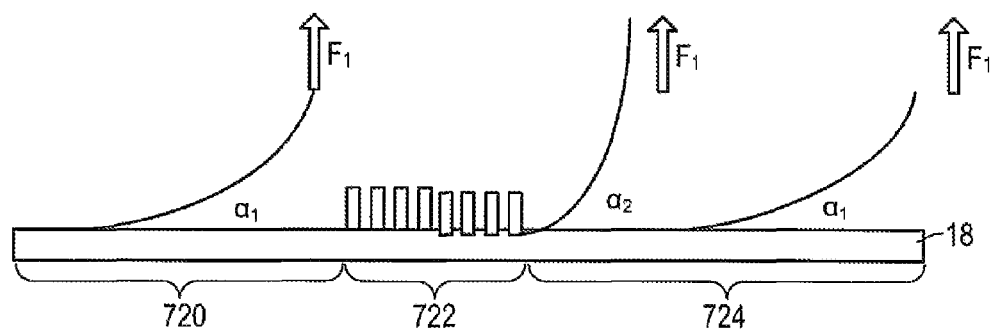
FIGS. 7A and 7B illustrate template curvature and the corresponding shear strain of its surface depending on template feature density.
Figure 7B:
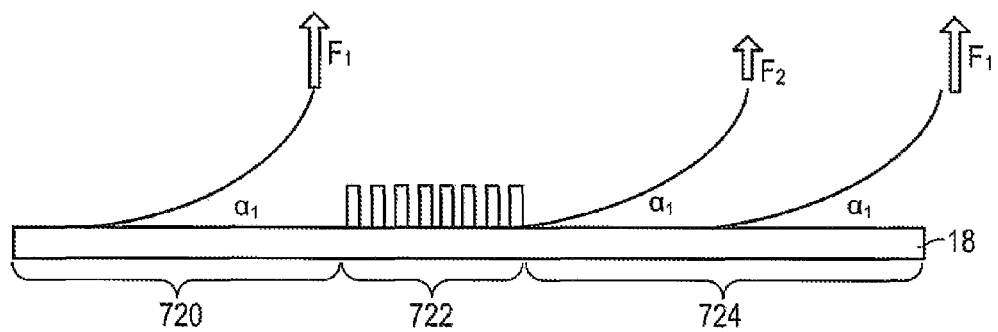

FIGS. 7A and 7B illustrate template curvature and the corresponding shear strain of its surface depending on template feature density. The relative curvature (indicated by the separation angle a) represents flexing of the substrate 12 (not shown) due to strain during separation from the template 18. Here, a change in strain and curvature occurs because a larger force is required to overcome a greater friction force (in addition to an adhesion force) to separate the template 18 from the substrate 12 in a dense feature area 722 than in a sparse feature area 720 and 724. Here, the separation angle a is shown in FIG. 7A as $a_1$ in the sparse feature areas 720 and 724, and is shown as $a_2$ in the dense feature area 722.

Varying the forces applied to the substrate 12 and/or the template 18, as shown in FIG. 7B, (illustrated by $F_1$ and $F_2$) as separation progresses through variations in feature density may improve robust layer separation.

Figure 8:
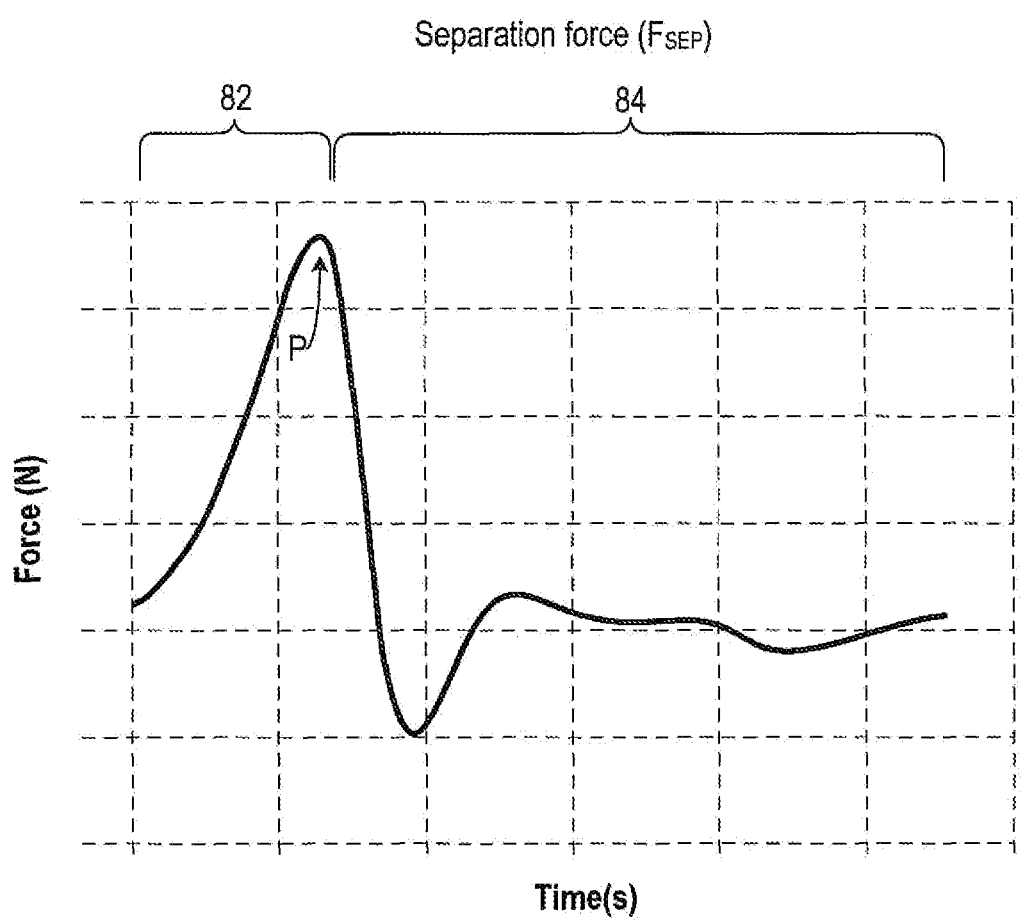
FIG. 8 illustrates a graphical representation of separation force over time.

In another embodiment, as illustrated by the graph in FIG. 8, separation between template 18 and substrate 12 may generally comprise two steps. In a step 82, the separation force $F_{SEP}$ between template 18 may be increased to a peak P. Such an increase may cause an initial crack in the imprint field. For example, the increase in separation force $F_{SEP}$ may cause an initial crack at one or more corners of the imprint field, starting the separation of the template 18 and substrate 12. In a step 84, separation force $F_{SEP}$ may be dramatically reduced. For example, the separation force $F_{SEP}$ may be reduced from a maximum value to zero, or very low, in a very short amount of time. In one embodiment, the force reduction time is approximately 10 ms.

Referring back to FIG. 4, one embodiment varies applied forces to control lateral motion of the template 18 with respect to the substrate 12 during separation, to reduce, if not minimize shearing stress. For example, during the separation process, the template 18 may conform to the features 50 in the un-separated area 440. The lateral motion between template 18 and features 50 may be constrained by the friction force between template 18 and features 50. However, the imprint head 30 (as seen in FIG. 1) may also be affected by the friction force between template 18 and features 50. For example, imprint head 30 may be overconstrained during the imprint process resulting in some energy storage in one or more elastic elements of the imprint head 30. Just before the last moment of separation between template 18 and substrate 12, the friction force between template 18 and features 50 may be quickly reduced to zero. The stored potential energy within imprint head 30 may be released at this time, which may result in relative xy-motion between template 18 and substrate 12.

Figure 9:
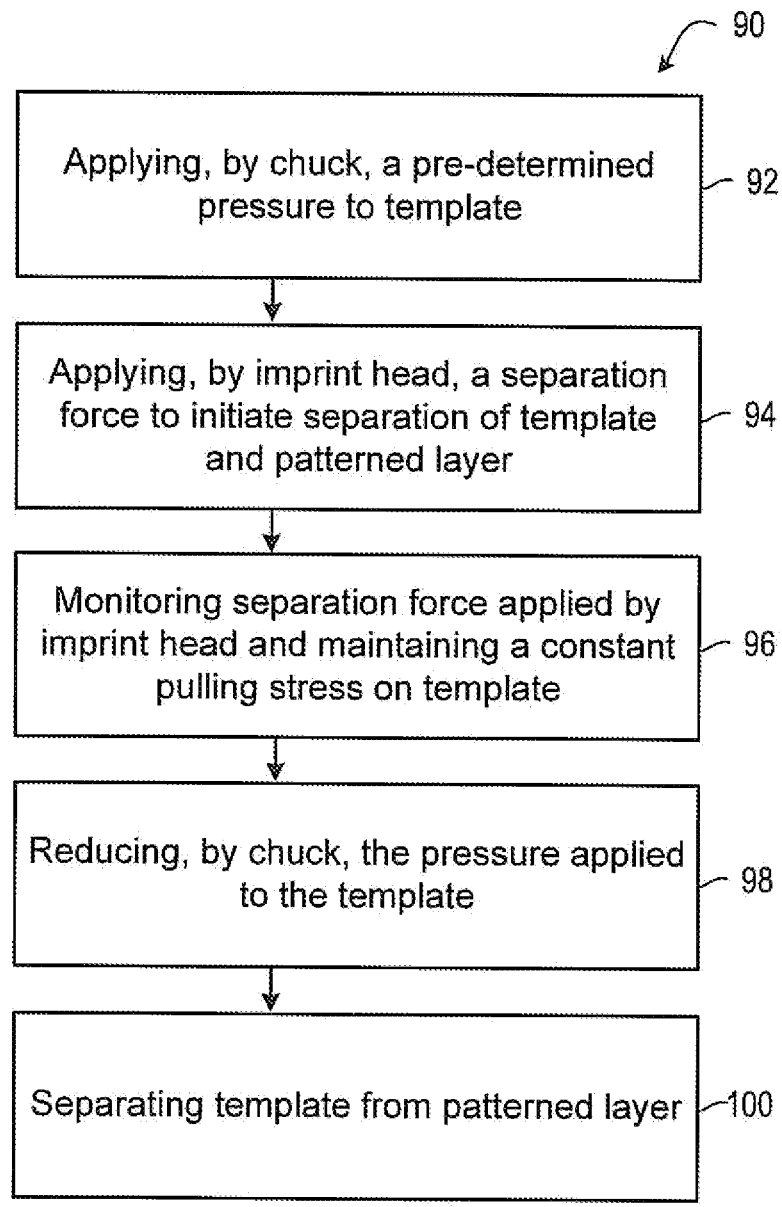
FIG. 9 illustrates a flow chart of an exemplary method for separating a template from a patterned layer while minimizing shearing and pulling stress

FIG. 9 illustrates a process 90 (and refers to FIG. 10) of an exemplary method for separating template 18 from substrate 12 while minimizing shearing and pulling stress by limiting lateral displacement. In a step 92, a predetermined pressure may be applied by chuck 28 to the template 18. In a step 94, separation force $F_{SEP}$ may be applied by imprint head 30 to initiate separation of template 18 and patterned layer (solidified layer) 46. In a step 96, the separation force $F_{SEP}$ applied by imprint head 30 may be monitored to a constant pulling stress. For example, forces applied to imprint head 30 may be monitored as patterned layer 46 separates towards center C of template 18. In a step 98, chuck 28 may reduce the predetermined pressure applied to template 18. In a step 100, template 18 may be separated from patterned layer 46.

Using this approach, curvature of the contact line 60 may be controlled at a level that may be tolerated by properties of polymerizable material 34 and/or patterned layer 46, and then gradually reduced to zero with the reduced pressure. For example, pressure applied to template 18 by chuck 28 may be balanced by stress forces caused by bending of template 18 during separation. As pressure is reduced, these stress forces may provide for the separation of template 18 from patterned layer 46.

The pressure gradient provided by chuck 28 may generally be directed from high to low pressure (e.g., from inside of chuck 28 toward outside), and may be perpendicular to patterning surface 22 of template 18. As fluids generally are not able to support shear while in a static state, the separation force $F_{SEP}$ may remain substantially normal to the patterning surface 22. As such, z motion from imprint head 30 may not be required during the final moments of separation of the template 18 from the patterned layer 46. Thus, by controlling the forces applied by imprint head 30 and the pressure applied by chuck 28, shearing load based on lateral displacement may be controlled during separation of template 18 and patterned layer 46.

In an alternative embodiment, step 92 may be considered optional, given that chuck 28 need not apply the predetermined pressure to template 18 prior to initiation of separation of template 18 and patterned layer 46. As such, partial vacuum pressure may be used to separate template 18 from patterned layer 46 solely at the final moments of separation. Using this method, motion of contact line 60 during the final moments of separation may be independent of imprint head 30 motion. For example, vertical separation motion may be generated by template 18 and/or substrate 12 pressure or vacuum tracking control. As such, there may be limited shearing defects resulting from translation or rotation error motion of the z separation mechanism. The shear strain resulting from the long range separation motion may be released by controlling the position of imprint head 30 and/or relocating substrate 12. This may reduce requirements for substantial accuracy during the separation motion. Further, the lateral motion that may be caused by curvature of template 18 may be minimized as deflection of template 18 at the final moment of separation is generally minimized.

Varying the Acceleration and Velocity of Applied Forces

In another embodiment, the acceleration and/or the velocity of applied forces may be varied or modified to achieve robust layer separation of the template 18 and the substrate 12. Considering FIG. 10, the imprint head 30 may pull the template 18 away from the substrate 12 at a high rate of acceleration. Due to inertia of the template 18 and substrate 12 (their mass and also the inertia of air around the contact area), the dynamic template 18 and substrate 12 strains during acceleration will be higher than at a constant velocity. The inertial effect will result in extra strain energy stored in the template 18 and substrate 12 during acceleration, similar to storing energy in a spring under similar conditions. This "spring" energy is converted to kinetic energy as the system reaches constant pulling velocity.

Increased strain at high acceleration may cause additional normal force, leading to additional friction. Though the steady state kinetic friction has weak velocity dependence, the transition from static friction force to the kinetic friction force is described as an avalanche like process, being sensitive to the rate of the transition. The established kinetic friction force is generally less than the static friction force. In other words, for a short time the resulting friction coefficient may increase. Also an attempt to move the template 18 fast (transition from static position to the motion) may increase the static coefficient of friction (the so called limiting value). This occurs because not all the points of contact where the template 18 and the patterned layer 46 attach to each other separate at the same time thereby resulting in extra separation energy being required. For example, this may occur during separation of interdigitated or interlocked features in a slightly tilted direction. This extra separation energy may lead to pattern damage, torn features, pull-ups and line collapse.

Since an increased friction force (and increased strain) is present with higher acceleration of operation, the strains in the template 18 and the substrate 12 may be expected to decrease with a separation process operating at a constant velocity or lower acceleration. In order to minimize the number of imprint defects, the separation velocity may be adjusted, modified, or varied in such a way that allows the friction force to be minimized during the separation process. In one embodiment, changes to the separation velocity are made while propagating separation of the template 18 and the substrate 12 through patterned regions of varying feature density. For example, the propagation velocity of the crack (separation) may change abruptly when transitioning from an area having a dense feature pattern into an area having a less dense feature pattern. The reverse is also true. In the former case, an extra elastic energy is released, thereby leading to abrupt acceleration of the crack velocity (separation velocity). Transient regions having moments of abrupt acceleration are more prone to imprint defects.

One of the ways to minimize transition region problems is to slow down the separation of the template 18 and the substrate 12. For example, if separation normally takes 10 to 100 ms to complete, slowing down the separation may comprise adjusting the process parameters in such a way that separation will take twice as long to complete, i.e. 20 to 200 ms. Separation speed can be controlled by monitoring the separation force applied to the template 18 and intentionally lowering the applied force. Thus, in one embodiment, the separation is slowed to a user-determined rate, thereby reducing or preventing surface bending and/or elastic energy storage in the template 18 and/or the substrate 12. In another embodiment, the velocity of the separation is controlled, maintaining a steady separation velocity while the crack moves through the feature pattern boundary.

Monitoring and Feedback

Figure 10:
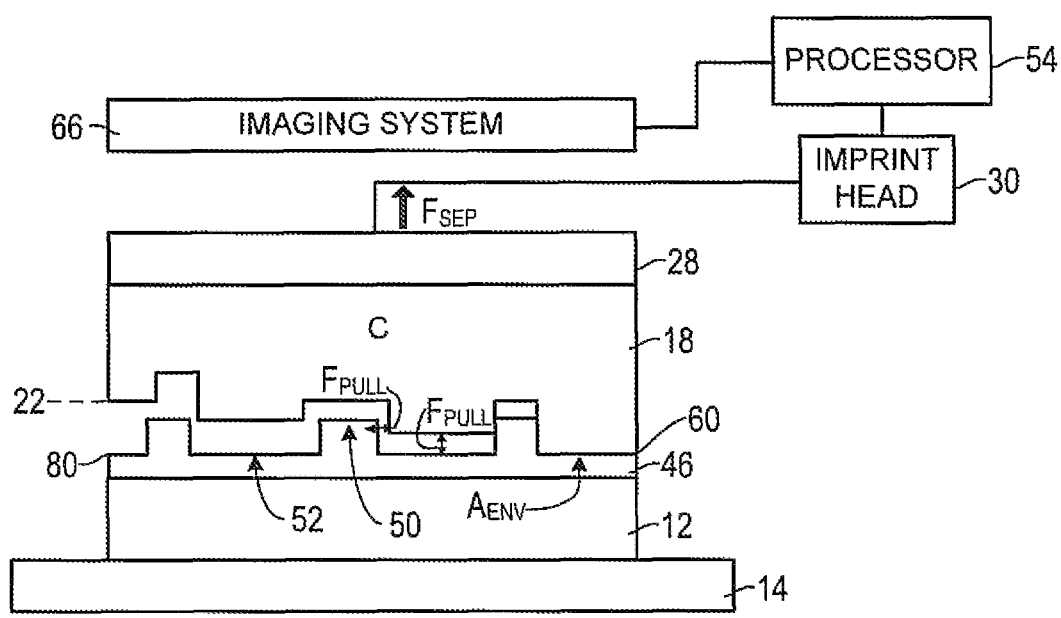

Referring to FIG. 10, separation of the template 18 and the substrate 12 may be monitored and/or tracked by analyzing the motion of the contact line 60 and/or the detection of the peak P separation force $F_{SEP}$. For example, the motion of contact line 60 (e.g., curvature and length), may be captured by imaging system 66. Imaging system 66 may be any system capable of providing macroscopic and/or microscopic views of patterned layer 46. Some examples of imaging system 66 may include a web cam, a video camera (tape, disc, or digital), a film camera (still or motion), a hyper-spectral imaging system (spectral interferometer), or the like. Imaging system 66 may be capable of providing still images and/or moving images for analysis of prospective issues arising with regard to patterned layer 46. Imaging system 66 may also be capable of storing and recalling still images and/or moving images, or transmitting them via a communication system.

In an embodiment, tracking of the separation contact line 60 on a patterned layer 46 provides feedback on the magnitude or velocity/acceleration of forces to apply at a given time. For example, a feedback control loop relative to an applied separation force $F_{SEP}$ may be provided to a user and/or to an automated system. An automated system receiving such feedback may automatically adjust the various forces applied, including the magnitude, velocity, and acceleration of vacuum, pressure, pulling force, and the like. Also, an automated system receiving such feedback may make adjustments to the physical components of the imprint system, including the tilt, alignment, rotation, angles, and the like of various components. Such control of the applied forces and the physical components may improve robust layer separation within patterned layer 46.

Figure 11:
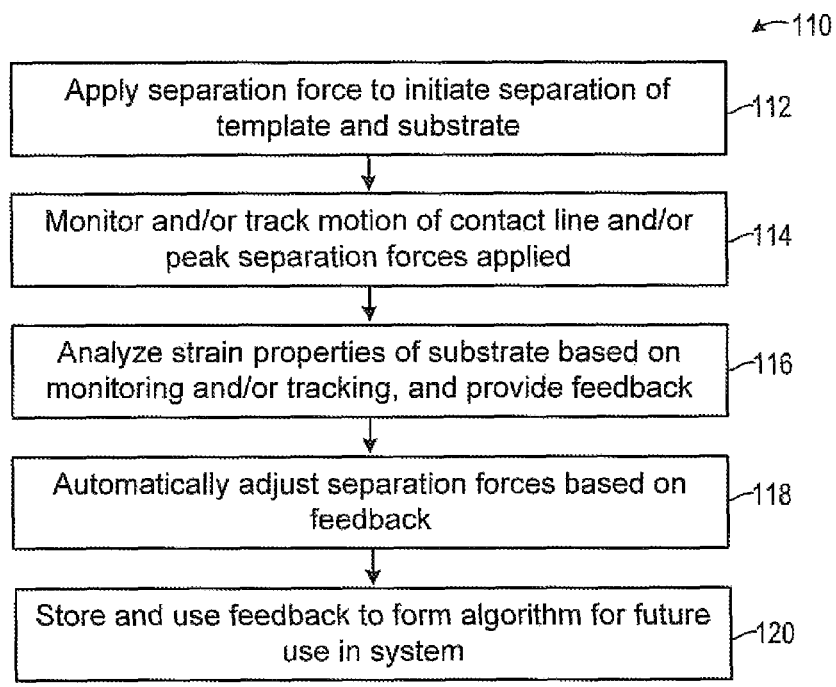
FIG. 11 illustrates a flow chart of an exemplary method for separating a template from a patterned layer while minimizing shearing and pulling stress by employing feedback, monitoring, and tracking.

FIG. 11 illustrates a flow chart of an exemplary method 110 for improving robust layer separation by using feedback to control the separation forces applied over a period of time. In step 112, a separation force may be applied to initiate separation between template 18 and substrate 12. For example, imprint head 30 may apply separation force $F_{SEP}$ to template 18 separating template 18 from patterned layer 46. Such an application of separation forces may cause an initial crack between template 18 and patterned layer 46.

In step 114, the motion of contact line 60 (e.g., curvature and length) and/or peak P of separation forces may be monitored and/or tracked for analysis of prospective issues arising with regard to patterned layer 46. The monitoring and tracking may be performed by various imaging systems 66.

In step 116, the strain properties of the substrate and/or the template may be analyzed based on the data gathered from the monitoring and/or tracking. Feedback may then be provided based on the monitoring and/or tracking, and the analysis performed.

In step 118, feedback from tracking of the contact line 60 and/or peak P may be used to adjust, modify, or vary the applied separation forces. In one example, the amount of curvature of contact line 60 may be monitored. If the curvature reaches a predetermined level or has predetermined characteristics suggesting a probability of defects, various separation forces may be reduced, increased, or changes may be made to their velocity, acceleration, direction of application, or the like. In an exemplary embodiment, the adjusting, modifying, or varying may be performed automatically.

In step 120, results of the feedback information for separation between template 18 and patterned layer 46 may be stored and used to form an algorithm for future use and application in system 10.

Dummy Fill Patterns

As discussed earlier, the transition from a densely patterned region to a sparsely patterned region during separation represents a concern. Feature damage due to shear and cohesive failures have been observed to be dominant at the transition region, where a change in separation velocity due to feature density variation may lead to a change in stress exerted upon the fine features.

In many cases, so-called "dummy patterns" may be included in designs for integrated circuit (IC) manufacturing to equalize etch loading and improve chemical mechanical polishing (CMP). Dummy patterns are extraneous fill patterns included on a template 18, and are arranged around areas of critical or pertinent feature patterns on the template 18. The use of dummy patterns may greatly improve robust layer separation by reducing or eliminating occurrences of transitioning between areas of higher density feature patterns and lower density feature patterns, by filling in lower density feature areas with extraneous patterns. In order to reduce defects in an imprint process, the dummy pattern layout should take into account the proximity to the critical dense features of interest, the size and shape required to minimize the jumps in elastic energy that may be experienced during separation, and a fill factor that is closely matched to the feature pattern of the critical patterned area. Also, it is desirable that orientation and/or symmetry of the dummy pattern is selected to match mechanical stresses experienced in the critical dense region. Within the constraints of the design for device functionality, dummy patterns may be placed as closely as possible to the field of the pertinent dense patterns. In one embodiment, the separation is no more than a few hundred nanometers.

Figure 12:
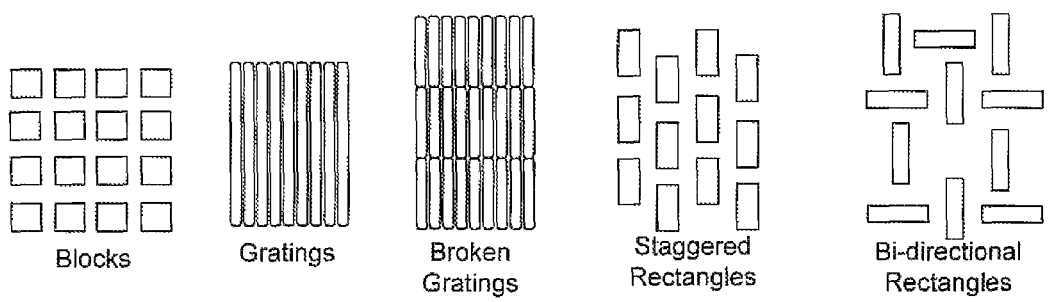
FIG. 12 illustrates various dummy fill pattern options.

FIG. 12 illustrates various dummy fill options. As shown, a variety of dummy patterns may be considered, for example, blocks, gratings, broken gratings, staggered rectangles, bi-directional rectangles, and the like may be used. The fill factor or pattern density of the dummy pattern may take into account the pattern being matched. In an exemplary general rule, a 50% dummy pattern fill may be targeted.

In one embodiment, initial separation force may be reduced by varying the pattern density of the template 18. This may be accomplished using a serrated or wave-like pattern as a dummy fill on the mesa 20 portion of the template 18. Generally, the mesa 20 is substantially normal to the direction of separation along a majority of the perimeter of the interface 60. This orientation results in the need for a greater overall force to initiate separation, since the strain along the perimeter is nearly equal everywhere.

In one embodiment, a serrated or wave-like mesa (with many small serrations like on a postage stamp or knife blade) is used to help initiate separation of the template 18 and the substrate 12. Using a serrated or wave-like pattern as a dummy fill on the mesa 20 portion of the template 18 may allow the use of a lesser separation force to initiate separation by concentrating the stresses along the small serrations. The use of a lesser initial separation force may be beneficial in improving robust layer separation by reducing the peak force P applied during the separation process as discussed above, and by providing greater control of forces applied throughout the separation process.

Chuck Pin Removal

In another embodiment, the chuck 28 apparatus may be modified or altered to improve robust layer separation. The rigid template 18 may be considered as a beam with multiple supports. The supports do not change as a force is applied to the template 18, so the template 18 strain is generally linear with an applied separation force. In contrast, the substrate 12 makes and breaks contact with various pins during the application of applied forces during the separation process. Further, the underneath "free span" region of the substrate 12, on which vacuum is applied, changes as force is applied to it; therefore, the substrate 12 strain will generally be nonlinear with applied force.

The substrate 12 strain may be more linear if used with a pin-less wafer chuck. Removing pins from the chuck 28 creates areas having more linear reaction to the forces applied. In one embodiment, a plurality of predetermined chuck pins are removed from the chuck 28 at critical stress areas. In an embodiment, the predetermined chuck pins are those that are located at positions along the substrate 12 having the greatest non-linear dependence of strain versus stress of the substrate 12. In a further embodiment, the predetermined chuck pins are those in areas of last contact points between the substrate 12 and the template 18 during separation. For example, non-linear strain-stress dependence may be reduced by removing chuck pins at the center area of the imprint and/or near the last point of contact between substrate 12 and template 18. A more linear separation increases robust layer separation, and may minimize the possibility of defects on separation.

What is claimed is:

1. A method of patterning a substrate with a template, the template having a first relief pattern, and separating the template from the substrate, the method comprising:
    transferring a second relief pattern to the substrate corresponding to the first relief pattern on the template, the transferring comprising forming the second relief pattern in a formable liquid between the substrate and the template corresponding to the first relief pattern on the template, the formable liquid forming a solidified layer deposited on the substrate;
    applying a predetermined pressure to the template;
    applying a separation force normal to the solidified layer to initiate separation of the template from the solidified layer;
    monitoring a velocity of a separation crack formed between the template and the solidified layer during separation of said template from said solidified layer, wherein the separation crack forms and propagates at least in the x-y horizontal plane defined by the template/substrate interface;
    reducing the pressure applied to the template during separation; and
    controlling the magnitude of the applied separation force to maintain a steady separation crack velocity as the template separates from the solidified layer.

2. The method of claim 1 further comprising applying a predetermined pressure and/or vacuum to the substrate prior to applying the separation force.

3. The method of 1 further comprising monitoring the separation crack velocity using an imaging system.

4. The method of claim 3 wherein the imaging system tracks the motion of the separation crack between the template and the solidified layer during separation.

5. The method of claim 4 wherein the controlling the magnitude of the separation force further comprises analyzing the motion of the separation crack and, based on the analysis, adjusting the applied separation force to maintain the steady separation crack velocity.

6. The method of claim 1 wherein controlling the magnitude of the separation force further comprises adjusting the applied separation force based on the feature density of the first relief pattern in the region of separation.

* * * * *